US012615882B2

(12) United States Patent　　(10) Patent No.:　US 12,615,882 B2
Yamashita　　(45) Date of Patent:　Apr. 28, 2026

(54) NITRIDE SEMICONDUCTOR LIGHT-EMITTING ELEMENT

(71) Applicant: NICHIA CORPORATION, Anan (JP)

(72) Inventor: Tomoya Yamashita, Anan (JP)

(73) Assignee: NICHIA CORPORATION, Anan (JP)

( * ) Notice: Subject to any disclaimer, the term of this patent is extended or adjusted under 35 U.S.C. 154(b) by 419 days.

(21) Appl. No.: 18/331,263

(22) Filed: Jun. 8, 2023

(65) Prior Publication Data

US 2023/0411553 A1　　Dec. 21, 2023

(30) Foreign Application Priority Data

Jun. 17, 2022　(JP) ................................. 2022-098120

(51) Int. Cl.
| | |
|---|---|
| *H01L 33/00* | (2010.01) |
| *H10H 20/01* | (2025.01) |
| *H10H 20/811* | (2025.01) |
| *H10H 20/815* | (2025.01) |

(52) U.S. Cl.
CPC .... *H10H 20/01335* (2025.01); *H10H 20/811* (2025.01); *H10H 20/815* (2025.01)

(58) Field of Classification Search
CPC ........... H10H 20/01335; H10H 20/811; H10H 20/815; H10H 20/812
See application file for complete search history.

(56) References Cited

U.S. PATENT DOCUMENTS

| | | | | |
|---|---|---|---|---|
| 5,670,789 A | * | 9/1997 | Iwata ................... | H10H 20/812 257/E33.005 |
| 5,684,309 A | * | 11/1997 | McIntosh ......... | H10H 20/01335 257/97 |
| 7,084,420 B2 | * | 8/2006 | Kim ..................... | H10H 20/825 257/14 |
| 7,923,716 B2 | * | 4/2011 | Lee ........................ | B82Y 20/00 257/14 |
| 8,716,694 B2 | * | 5/2014 | Han ..................... | H10H 20/824 257/23 |

(Continued)

FOREIGN PATENT DOCUMENTS

| | | |
|---|---|---|
| JP | 2008-041807 A | 2/2008 |
| JP | 2008-103711 A | 5/2008 |

(Continued)

*Primary Examiner* — Jay C Kim

(74) *Attorney, Agent, or Firm* — Foley & Lardner LLP

(57)　　ABSTRACT

A method for manufacturing a nitride semiconductor light-emitting element includes: forming an n-side layer; forming an active layer on the n-side layer; and forming a p-side layer on the active layer. The step of forming the active layer includes: forming a first layered section comprising a first well layer having a first thickness, and a first barrier layer, at a first temperature, forming a second layered section on the first layered section, the second layered section comprising a second well layer having a thickness greater than the first thickness, and a second barrier layer, at a second temperature lower than the first temperature, and forming a third layered section on the second layered section, the third layered section comprising a third well layer having a third thickness less than the second thickness, and a third barrier layer, at a third temperature higher than the second temperature.

17 Claims, 3 Drawing Sheets

5

(56)  References Cited

U.S. PATENT DOCUMENTS

| | | | | |
|---|---|---|---|---|
| 9,018,618 B1 * | 4/2015 | Lee | H10H 20/812 | |
| | | | | 257/14 |
| 9,190,561 B2 * | 11/2015 | Teranishi | H10H 20/825 | |
| 9,337,383 B2 * | 5/2016 | Han | H10H 20/811 | |
| 11,876,148 B2 * | 1/2024 | Okada | H10H 20/812 | |
| 2006/0086932 A1 * | 4/2006 | Kim | H10H 20/825 | |
| | | | | 257/13 |
| 2008/0093593 A1 | 4/2008 | Ryu | | |
| 2010/0019223 A1 | 1/2010 | Kang et al. | | |
| 2011/0121259 A1 * | 5/2011 | Han | H10H 20/812 | |
| | | | | 257/13 |
| 2011/0187294 A1 * | 8/2011 | Bergmann | H10H 20/811 | |
| | | | | 315/363 |
| 2012/0032209 A1 | 2/2012 | Shioda et al. | | |
| 2012/0241770 A1 | 9/2012 | Na et al. | | |
| 2012/0286237 A1 * | 11/2012 | Nago | B82Y 20/00 | |
| | | | | 257/13 |
| 2018/0351039 A1 | 12/2018 | Kim | | |
| 2021/0320224 A1 * | 10/2021 | Tasai | H10H 20/812 | |
| 2022/0199855 A1 * | 6/2022 | Abe | H10H 20/81 | |

FOREIGN PATENT DOCUMENTS

| | | |
|---|---|---|
| JP | 2008-130832 A | 6/2008 |
| JP | 2010-028072 A | 2/2010 |
| JP | 2011-029218 A | 2/2011 |
| JP | 2012-038958 A | 2/2012 |
| JP | 2012-204839 A | 10/2012 |
| JP | 2013-187296 A | 9/2013 |

* cited by examiner

NITRIDE SEMICONDUCTOR LIGHT-EMITTING ELEMENT

CROSS-REFERENCE TO RELATED APPLICATIONS

The present application claims priority under 35 U.S.C. § 119 to Japanese Patent Application No. 2022-098120, filed Jun. 17, 2022, the contents of which are hereby incorporated by reference in their entirety.

BACKGROUND

The present invention relates to a nitride semiconductor light-emitting element.

Japanese Patent Publication No. 2008-103711 discloses a nitride light-emitting element including an active layer having a multiple quantum well structure in which well layers and barrier layers are alternately layered.

SUMMARY

An object of an embodiment of the present disclosure is to provide a method for manufacturing a nitride semiconductor light-emitting element with improved output.

A method for manufacturing a nitride semiconductor light-emitting element according to an embodiment of the present invention includes forming an n-side layer, forming an active layer on the n-side layer, and forming a p-side layer on the active layer. The forming an active layer includes forming a first layered section to obtain a first layered section that includes a first well layer containing In and having a first thickness and also includes a first barrier layer formed on the first well layer and doped with an n-type impurity, the first well layer being formed at a first temperature in the forming a first layered section; forming a second layered section to obtain a second layered section that is formed on the first layered section, and includes a second well layer containing In and having a second thickness greater than the first thickness and also includes a second barrier layer formed on the second well layer and doped with an n-type impurity, the second well layer being formed at a second temperature lower than the first temperature in the forming a second layered section; and forming a third layered section to obtain a third layered section that is formed on the second layered section, and includes a third well layer containing In and having a third thickness less than the second thickness and also includes a third barrier layer formed on the third well layer and doped with a p-type impurity, the third well layer being formed at a third temperature higher than the second temperature in the forming a third layered section.

With a method for manufacturing a nitride semiconductor light-emitting element according to certain embodiments of the present invention, it is possible to provide a nitride semiconductor light-emitting element with improved output.

DETAILED DESCRIPTION

Figure 1:
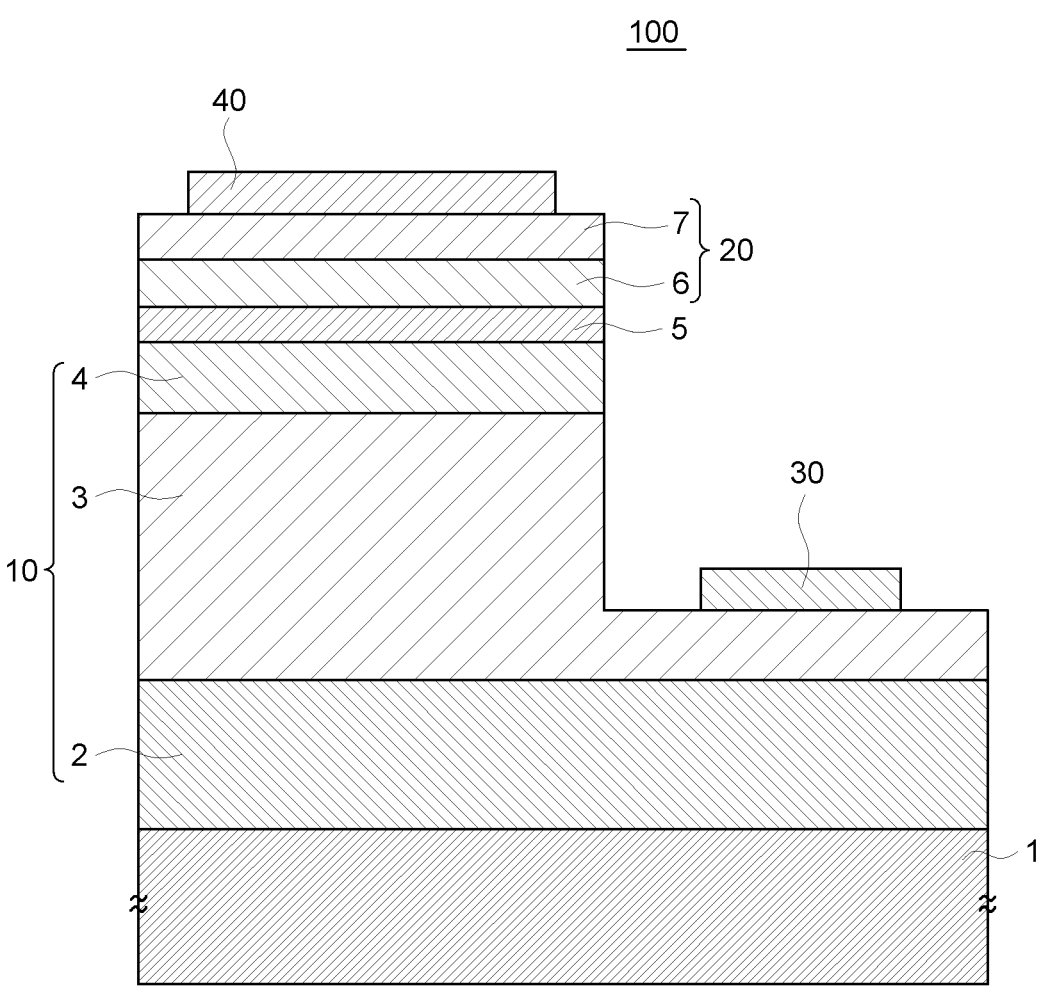
FIG. 1 is a cross-sectional view illustrating a configuration of a nitride semiconductor light-emitting element according to an embodiment of the present invention.

Embodiments will be described below with reference to the accompanying drawings. In the drawings, the same constituent elements are denoted using the same reference signs. Note that the drawings schematically illustrate embodiments, and thus scales, intervals, positional relationships, and the like of members may be exaggerated, or some of the members may not be illustrated in the drawings. As a cross-sectional view, an end view illustrating only a cut surface may be illustrated.

In the following description, components having substantially the same function may be denoted by the same reference signs and a description thereof may be omitted. Further, terms indicating a specific direction or position (for example, "upper," "lower," and other terms including those terms) may be used. However, these terms are used merely to make it easy to understand relative directions or positions in the referenced drawing. As long as a relative direction or position is the same as that described in the referenced drawings using the term such as "upper" or "lower," it is allowed that, in drawings other than the drawings of the present invention, actual products, or the like, the arrangement of components is not identical to the arrangement of components in the referenced drawings. In the present specification, a positional relationship expressed by using the term "on" includes a case in which an object is in contact and also a case in which an object is not in contact but located above. A thickness of each semiconductor layer refers to a thickness in a layering direction of the semiconductor layer.

A nitride semiconductor light-emitting element achieved by a manufacturing method of the present embodiment will be described below with reference to the accompanying drawings.

FIG. 1 is a schematic cross-sectional view illustrating a configuration of a nitride semiconductor light-emitting element of the present embodiment. As illustrated in FIG. 1, a nitride semiconductor light-emitting element 100 includes a substrate 1, an n-side layer 10 provided on the substrate 1, a p-side layer 20, and an active layer 5 located between the n-side layer 10 and the p-side layer 20. An n-electrode 30 is disposed on the n-side layer 10. A p-electrode 40 is disposed on the p-side layer 20. The active layer 5 emits light when a forward voltage is applied across the p-electrode 40 and the n-electrode 30.

Substrate 1

For example, an insulating substrate of sapphire, spinel ($MgAl_2O_4$), or the like taking any of a C plane, an R plane, and an A plane as a primary surface may be used as the substrate 1.

When a semiconductor layer made of a nitride semiconductor is epitaxially grown, it is preferable to use a sapphire substrate taking a C plane as a primary surface. The nitride semiconductor includes a semiconductor of any composition of a chemical formula of $In_xAl_yGa_{1-x-y}N$ ($0 \le x \le 1$, $0 \le y \le 1$, $x+y \le 1$) provided that the composition ratios x and y are varied within the respectively designated ranges. As the substrate 1, SiC (including 6H, 4H, and 3C), ZnS, ZnO, GaAs, Si, or the like may be used. The substrate 1 may have, for example, a rectangular shape in a top view. The length of one side of the substrate 1 is, for example, in a range from 100 µm to 2000 µm, and is preferably in a range from 500 µm to 1000 µm. The substrate 1 need not be finally provided.

N-Side Layer 10

As illustrated in FIG. 1, the n-side layer 10 includes a foundation layer 2, an n-side contact layer 3, and an n-side superlattice layer 4 in that order from the substrate 1 side. The n-side layer 10 includes at least one semiconductor layer containing an n-type impurity. As the n-type impurity, for example, silicon (Si) or germanium (Ge) may be used. The n-side layer 10 is required to have a function of supplying electrons and may include an undoped layer that is intentionally formed without being doped with an n-type impurity or a p-type impurity.

The foundation layer 2 is disposed between the substrate 1 and the n-side contact layer 3. By disposing the foundation layer 2, the n-side contact layer 3 having high crystallinity can be formed on the upper surface of the foundation layer 2. AlGaN, GaN, or the like may be used for the foundation layer 2, for example. A buffer layer may be formed between the substrate 1 and the foundation layer 2. The buffer layer is a layer for reducing a lattice mismatch between the substrate 1 and the foundation layer 2. Undoped AlGaN, GaN, or the like may be used for the buffer layer, for example. The thickness of the buffer layer is in a range from 20 nm to 30 nm, for example.

The n-side contact layer 3 is disposed on the upper surface of the foundation layer 2 and contains an n-type impurity in at least part thereof. As illustrated in FIG. 1, the n-electrode 30 is disposed on the upper surface of the n-side contact layer 3. The n-side contact layer 3 is preferably doped with an n-type impurity at a relatively high concentration in order to supply electrons from the n-electrode 30 toward the active layer 5. The n-type impurity concentration of the n-side contact layer 3 may be in a range, for example, from $6 \times 10^{18}/cm^3$ to $1 \times 10^{19}/cm^3$. GaN, AlGaN, or the like may be used for the n-side contact layer 3, for example. The n-side contact layer 3 may have a lamination structure including a plurality of semiconductor layers. The n-side contact layer 3 may have, for example, a lamination structure in which undoped GaN and GaN doped with an n-type impurity are alternately layered. The thickness of the n-side contact layer 3 is, for example, in a range from 5 µm to 20 µm.

The n-side superlattice layer 4 is disposed on the upper surface of the n-side contact layer 3. By disposing the n-side superlattice layer 4, a lattice mismatch between the n-side contact layer 3 and the active layer 5 can be reduced, and the crystallinity of the active layer 5 can be improved. The n-side superlattice layer 4 has a lamination structure in which semiconductor layers having different lattice constants are alternately layered. The n-side superlattice layer 4 includes n single pairs each including one undoped InGaN layer and one undoped GaN layer, for example. The number of pairs n of the n-side superlattice layer 4 may be, for example, in a range from 10 to 40, preferably in a range from 15 to 35, and more preferably in a range from 25 to 35. The n-side superlattice layer 4 need not be disposed.

Active Layer 5

Figure 2:
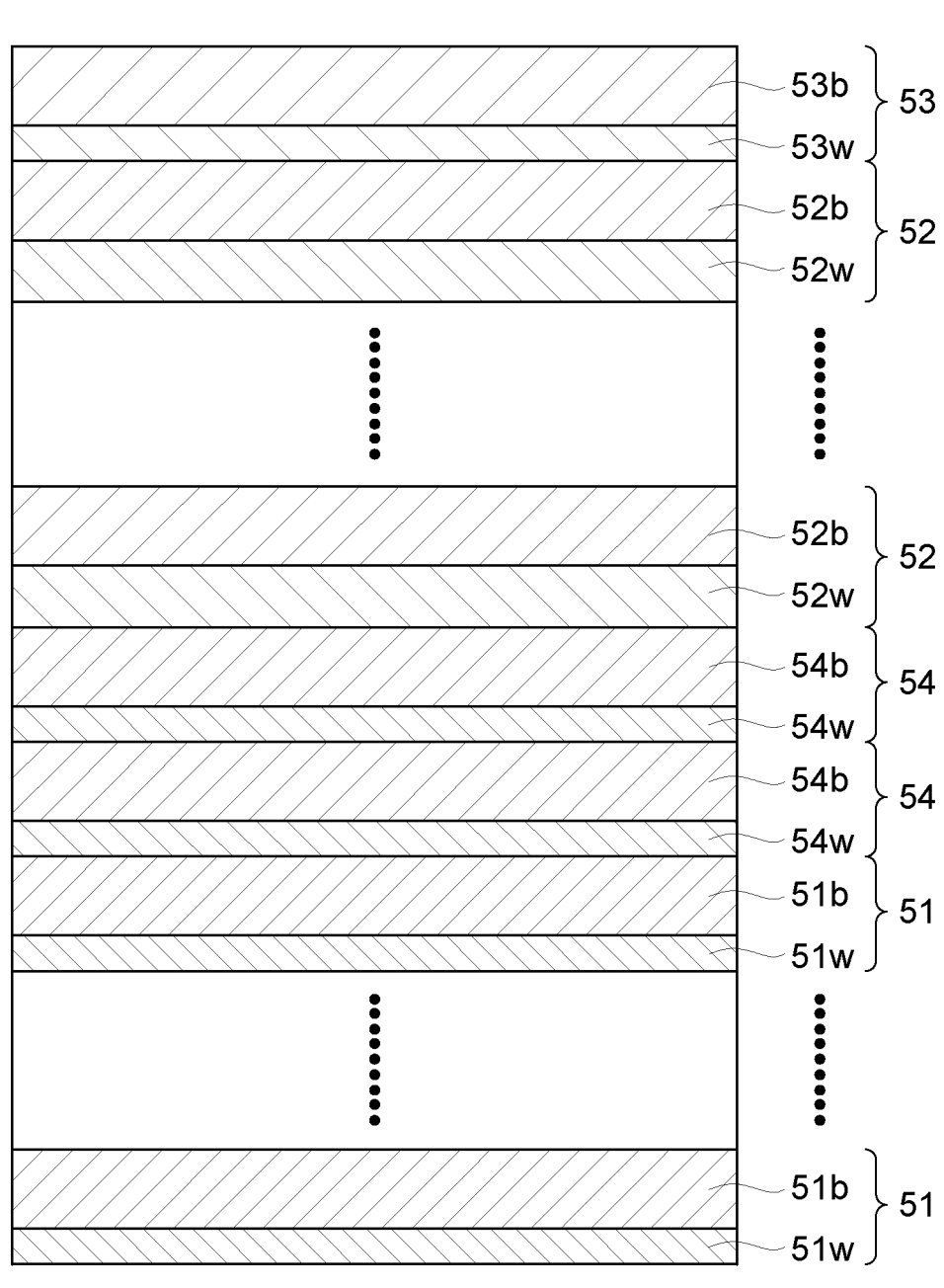
FIG. 2 is a cross-sectional view illustrating a configuration of a nitride semiconductor light-emitting element according to an embodiment of the present invention.

FIG. 2 is a schematic cross-sectional view for explaining a detailed structure of the active layer 5. As illustrated in FIGS. 1 and 2, the active layer 5 includes a first layered section 51, a second layered section 52, and a third layered section 53 in that order from the n-side layer 10 side. The active layer 5 further includes a fourth layered section 54 between the first layered section 51 and the second layered section 52. The first layered section 51 includes a first well layer 51w and a first barrier layer 51b. The second layered section 52 includes a second well layer 52w and a second barrier layer 52b. The third layered section 53 includes a third well layer 53w and a third barrier layer 53b. The fourth layered section 54 includes a fourth well layer 54w and a fourth barrier layer 54b. In the present embodiment, the active layer 5 includes a plurality of the first layered sections 51, a plurality of the second layered sections 52, the one third layered section 53, and a plurality of the fourth layered sections 54. The number of first layered sections 51 may be, for example, in a range from four to six. The number of second layered sections 52 may be, for example, in a range from four to eight. The number of fourth layered sections 54 may be, for example, in a range from one to four. The active layer 5 may include a plurality of the third layered sections 53. The active layer 5 may include the one first layered section 51 and the one second layered section 52. The active layer 5 may include no fourth layered section 54.

The band gap energy of the first well layer 51w is lower than the band gap energy of the first barrier layer 51b. The first well layer 51w contains indium (In). An undoped InGaN layer may be used for the first well layer 51w, for example. The In composition ratio of the first well layer 51w is in a range from 10% to 15%, for example.

A first thickness of the first well layer 51w is less than a second thickness of the second well layer 52w. As a result, the well layers located on the p-side layer 20 side relative to the first well layer 51w are supplied with a larger number of electrons, thereby making it possible to lower the forward voltage. The first thickness of the first well layer 51w is less than the second thickness of the second well layer 52w, so that radiative recombination is less likely to occur in the first well layer 51w than in the second well layer 52w. The first thickness may be, for example, in a range from 0.5 nm to 4.0 nm, preferably in a range from 1.0 nm to 2.5 nm, and more preferably in a range from 1.2 nm to 2.0 nm.

The first barrier layer 51b is disposed on the first well layer 51w. The first barrier layer 51b is doped with an n-type impurity. By causing the first barrier layer 51b to contain the n-type impurity, the well layers located on the p-side layer 20 side relative to the first barrier layer 51b are likely to be supplied with electrons, thereby making it possible to lower the forward voltage. A GaN layer containing Si as the n-type impurity, for example, may be used for the first barrier layer 51b. The n-type impurity concentration of the first barrier layer 51b may be lower than the n-type impurity concentration of the fourth barrier layer 54b. The n-type impurity concentration of the first barrier layer 51b may be, for example, in a range from $1 \times 10^{17}/cm^3$ to $3 \times 10^{19}/cm^3$, preferably in a range from $2 \times 10^{17}/cm^3$ to $1 \times 10^{19}/cm^3$, and more preferably in a range from $3 \times 10^{17}/cm^3$ to $8 \times 10^{18}/cm^3$.

The thickness of the first barrier layer 51b may be in a range from 5 nm to 20 nm, and preferably in a range from 10 nm to 18 nm. When the thickness of the first barrier layer 51b is not less than 5 nm, the shortage of carriers can be suppressed. When the thickness of the first barrier layer 51b is not more than 20 nm, deterioration in crystallinity due to an increase of the n-type impurity can be suppressed.

The second well layer 52w is disposed on the first barrier layer 51b. The band gap energy of the second well layer 52w is lower than the band gap energy of the second barrier layer 52b. The second well layer 52w contains In. An undoped InGaN layer may be used for the second well layer 52w, for example.

The second well layer 52$w$ is a well layer in which radiative recombination is most likely to occur among the plurality of well layers included in the active layer 5. The light emission peak wavelength of the nitride semiconductor light-emitting element 100 is substantially the same as that of the second well layer 52$w$. The second well layer 52$w$ emits, for example, ultraviolet light or visible light. The second well layer 52$w$ may emit, for example, blue light or green light as visible light. The light emission peak wavelength of the second well layer 52$w$ may be, for example, in a range from 430 nm to 570 nm, and preferably in a range from 500 nm to 570 nm. The In composition ratio of the second well layer 52$w$ may be, for example, in a range from 20% to 28%, and preferably in a range from 24% to 28%. The second well layer 52$w$ having the In composition ratio in such a range emits green light.

The second thickness of the second well layer 52$w$ is greater than the first thickness of the first well layer 51$w$. This makes it possible to increase the volume of the second well layer 52$w$ and raise the probability of radiative recombination of electrons and holes in the second well layer 52$w$. The second thickness of the second well layer 52$w$ is, for example, not less than 1.5 times and not more than 3 times the first thickness of the first well layer 51$w$. By setting the second thickness to be not less than 1.5 times the first thickness, the radiative recombination in the second well layer 52$w$ can more easily occur than the radiative recombination in the first well layer 51$w$. By setting the second thickness to be not more than 3.0 times the first thickness, it is possible to suppress the deterioration in crystallinity due to the second well layer 52$w$ being thickened. The second thickness may be, for example, in a range from 2.0 nm to 5.5 nm, preferably in a range from 2.5 nm to 4.0 nm, and more preferably in a range from 2.8 nm to 3.5 nm.

The second barrier layer 52$b$ is disposed on the second well layer 52$w$. The second barrier layer 52$b$ is doped with an n-type impurity. By causing the second barrier layer 52$b$ to contain the n-type impurity, the second well layer 52$w$ is likely to be supplied with electrons, thereby making it possible to lower the forward voltage. A GaN layer containing Si as the n-type impurity, for example, may be used for the second barrier layer 52$b$. The n-type impurity concentration of the second barrier layer 52$b$ may be, for example, in a range from $1 \times 10^{17}/\text{cm}^3$ to $3 \times 10^{19}/\text{cm}^3$, preferably in a range from $2 \times 10^{17}/\text{cm}^3$ to $1 \times 10^{19}/\text{cm}^3$, and more preferably in a range from $3 \times 10^{17}/\text{cm}^3$ to $8 \times 10^{18}/\text{cm}^3$.

It is preferable that the thickness of the second barrier layer 52$b$ be less than the thickness of the first barrier layer 51$b$. This makes it easier to supply holes supplied from the third layered section 53 side to the second well layer 52$w$ via the second barrier layer 52$b$. The thickness of the second barrier layer 52$b$ may be in a range from 3 nm to 15 nm, and preferably in a range from 5 nm to 10 nm. When the thickness of the second barrier layer 52$b$ is not less than 3 nm, the holes supplied from the third layered section 53 side are easily supplied to the second well layer 52$w$. When the thickness of the second barrier layer 52$b$ is not more than 15 nm, the deterioration in crystallinity due to the increase of the n-type impurity can be suppressed.

The third well layer 53$w$ is disposed on the second barrier layer 52$b$. The band gap energy of the third well layer 53$w$ is lower than the band gap energy of the third barrier layer 53$b$. The third well layer 53$w$ contains In. An undoped InGaN layer may be used for the third well layer 53$w$, for example. The In composition ratio of the third well layer 53$w$ is in a range from 10% to 15%, for example.

A third thickness of the third well layer 53$w$ is less than the second thickness of the second well layer 52$w$. With this configuration, the second well layer 52$w$ is supplied with a larger number of holes, and the probability of radiative recombination in the second well layer 52$w$ is raised, whereby the luminous efficiency of the nitride semiconductor light-emitting element 100 can be improved. The third thickness of the third well layer 53$w$ is less than the second thickness of the second well layer 52$w$, so that the radiative recombination is less likely to occur in the third well layer 53$w$ than in the second well layer 52$w$. The third thickness of the third well layer 53$w$ is less than the second thickness of the second well layer 52$w$. The third thickness of the third well layer 53$w$ may be, for example, in a range from 0.5 nm to 4.0 nm, preferably in a range from 1.0 nm to 2.5 nm, and more preferably in a range from 1.2 nm to 2.0 nm.

The third barrier layer 53$b$ is disposed on the third well layer 53$w$. The third barrier layer 53$b$ is doped with a p-type impurity in order to efficiently inject holes into the third well layer 53$w$ or the second well layer 52$w$. The p-type impurity is, for example, magnesium (Mg). The p-type impurity concentration of the third barrier layer 53$b$ is lower than that of a p-side barrier layer 6 to be described later. This makes it possible to easily supply holes from the third barrier layer 53$b$ to the second well layer 52$w$ while suppressing the deterioration in crystallinity due to the increase in the p-type impurity concentration, whereby the luminous efficiency of the nitride semiconductor light-emitting element 100 can be improved. The p-type impurity concentration of the third barrier layer 53$b$ may be, for example, in a range from $1 \times 10^{19}/\text{cm}^3$ to $5 \times 10^{19}/\text{cm}^3$, and preferably in a range from $1 \times 10^{19}/\text{cm}^3$ to $3 \times 10^{19}/\text{cm}^3$.

The thickness of the third barrier layer 53$b$ may be, for example, in a range from 3 nm to 30 nm, preferably in a range from 8 nm to 18 nm, and more preferably in a range from 12 nm to 14 nm. By setting the thickness of the third barrier layer 53$b$ to be not less than 3 nm, the deterioration in carrier injection efficiency can be suppressed. The crystallinity of the third barrier layer 53$b$ can be improved by setting a film thickness of the third barrier layer 53$b$ to be not more than 30 nm.

A first intermediate layer formed of an undoped semiconductor layer may be disposed between the third barrier layer 53$b$ and the third well layer 53$w$. By disposing the first intermediate layer, the deterioration in reliability due to diffusion of the p-type impurity contained in the third barrier layer 53$b$ into the second well layer 52$w$ and/or the third well layer 53$w$ can be suppressed. An undoped GaN layer, for example, may be used for the first intermediate layer.

The band gap energy of the fourth well layer 54$w$ is lower than the band gap energy of the fourth barrier layer 54$b$. The fourth well layer 54$w$ contains In. An undoped InGaN layer may be used for the fourth well layer 54$w$, for example. The In composition ratio of the fourth well layer 54$w$ is in a range from 10% to 15%, for example.

A fourth thickness of the fourth well layer 54$w$ is less than the second thickness of the second well layer 52$w$. As a result, the well layers located on the p-side layer 20 side relative to the fourth well layer 54$w$ are supplied with a larger number of electrons, thereby making it possible to lower the forward voltage. The fourth thickness of the fourth well layer 54$w$ is less than the second thickness of the second well layer 52$w$, so that the radiative recombination is less likely to occur in the fourth well layer 54$w$ than in the second well layer 52$w$. The fourth thickness may be, for example, in a range from 0.5 nm to 4.0 nm, preferably in a range from 1.0 nm to 2.5 nm, and more preferably in a range from 1.2 nm to 2.0 nm.

The fourth barrier layer 54b is disposed on the fourth well layer 54w. The fourth barrier layer 54b is doped with an n-type impurity. By causing the fourth barrier layer 54b to contain the n-type impurity, the well layers located on the p-side layer 20 side relative to the fourth barrier layer 54b are likely to be supplied with electrons, thereby making it possible to lower the forward voltage. A GaN layer containing Si as the n-type impurity, for example, may be used for the fourth barrier layer 54b. The n-type impurity concentration of the fourth barrier layer 54b may be, for example, in a range from $1\times10^{17}/cm^3$ to $1\times10^{19}/cm^3$, preferably in a range from $2\times10^{17}/cm^3$ to $5\times10^{18}/cm^3$, and more preferably in a range from $3\times10^{17}/cm^3$ to $2\times10^{18}/cm^3$.

The thickness of the fourth barrier layer 54b may be in a range from 5 nm to 30 nm, preferably in a range from 10 nm to 20 nm, and more preferably in a range from 13 nm to 16 nm. When the thickness of the fourth barrier layer 54b is not less than 5 nm, the shortage of carriers may be suppressed. When the thickness of the fourth barrier layer 54b is not more than 15 nm, the deterioration in crystallinity due to the increase of the n-type impurity can be suppressed.

As an example of the thickness of each of the well layers, the thickness of the first well layer 51w may be 1.5 nm, the thickness of the second well layer 52w may be 2.8 nm, and the thickness of the third well layer 53w may be 1.5 nm. When the active layer 5 includes such layer thicknesses, the probability of radiative recombination of electrons and holes in the first well layer 51w and the third well layer 53w can be reduced, whereby the second well layer 52w is likely to be supplied with electrons and holes. Thus, the luminous efficiency of the nitride semiconductor light-emitting element 100 can be improved.

Each of the first thickness, the third thickness, and the fourth thickness is less than the second thickness. The first thickness, the third thickness, and the fourth thickness may be the same, for example. The first thickness, the third thickness, and the fourth thickness need not be the same, and may be different from each other. For example, the fourth thickness may be less than the first thickness. With this configuration, electrons supplied from the first layered section 51 side are likely to be supplied to the second well layer 52w via the fourth well layer 54w.

In the active layer 5 configured as described above, electrons and holes are efficiently supplied to the second well layer 52w, and radiative recombination is more likely to occur in the second well layer 52w than in the other well layers, thereby making it possible to improve the output of the nitride semiconductor light-emitting element 100.
P-Side Layer 20

As illustrated in FIG. 1, the p-side layer 20 includes the p-side barrier layer 6 and a p-side contact layer 7 in that order from the active layer 5 side. The p-side layer 20 includes at least one semiconductor layer containing a p-type impurity. As the p-type impurity, for example, Mg may be used. The p-side layer 20 is required to have a function of supplying holes, and may include an undoped layer.

In the p-side layer 20, the p-side barrier layer 6 is located closest to the active layer 5. The p-side barrier layer 6 is disposed to confine electrons. For example, GaN or AlGaN containing a p-type impurity such as Mg may be used for the p-side barrier layer 6. The band gap energy of the p-side barrier layer 6 is higher than the band gap energy of the third barrier layer 53b. The thickness of the p-side barrier layer 6 is in a range from 10 nm to 50 nm, for example. The p-type impurity concentration of the p-side barrier layer 6 may be in a range from $2\times10^{20}/cm^3$ to $6\times10^{20}/cm^3$, for example.

The p-electrode 40 is disposed on the upper surface of the p-side contact layer 7. For example, GaN or AlGaN containing a p-type impurity such as Mg may be used for the p-side contact layer 7. The thickness of the p-side contact layer 7 is in a range from 10 nm to 150 nm, for example. The p-type impurity concentration of the p-side contact layer 7 may be in a range from $2\times10^{20}/cm^3$ to $2\times10^{21}/cm^3$, for example.

Next, a method for manufacturing a nitride semiconductor light-emitting element according to the present embodiment will be described.

Figure 3:
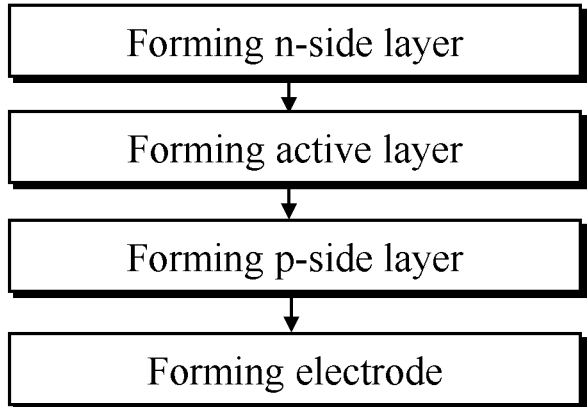
FIG. 3 is a process flowchart showing a process flow of a method for manufacturing a nitride semiconductor light-emitting element according to an embodiment of the present invention.

As illustrated in FIG. 3, a method for manufacturing a nitride semiconductor light-emitting element according to the present embodiment includes an n-side layer forming step, an active layer forming step, a p-side layer forming step, and an electrode forming step. Each of the semiconductor layers formed in the n-side layer forming step, the active layer forming step, and the p-side layer forming step is formed by, for example, a metal organic chemical vapor deposition (MOCVD) method in a reaction vessel in which pressure and temperature can be adjusted. Specifically, the n-side layer 10, the active layer 5, and the p-side layer 20 are formed on the substrate 1 by supplying a carrier gas and a raw material gas into the reaction vessel.

The raw material gas is appropriately selected according to the semiconductor layer to be formed. As a raw material gas containing Ga, for example, a trimethylgallium (TMG) gas or a triethylgallium (TEG) gas is used. As a raw material gas containing N, for example, an ammonia ($NH_3$) gas is used. As a raw material gas containing Al, for example, a trimethylaluminum (TMA) gas is used. As a raw material gas containing In, for example, a trimethylindium (TMI) gas is used. As a raw material gas containing Si, for example, a monosilane ($SiH_4$) gas is used. As a raw material gas containing Mg, for example, a biscyclopentadienyl magnesium ($Cp_2Mg$) gas is used. Examples of the carrier gas include a hydrogen gas and a nitrogen gas.
N-Side Layer Forming Step The n-side layer forming step is a step of forming the n-side layer 10 on the substrate 1. The n-side layer forming step includes a foundation layer forming step, an n-side contact layer forming step, and an n-side superlattice layer forming step.

In the foundation layer forming step, the foundation layer 2 is formed on the substrate 1. A buffer layer may be formed on the substrate 1 before forming the foundation layer 2, and then the foundation layer 2 may be formed with the buffer layer interposed therebetween. The buffer layer is formed by growing an AlGaN layer on the substrate 1 by using a TMA gas, a TMG gas, an ammonia gas, and the like as raw material gases. The temperature when the buffer layer is formed is, for example, 600° C. or less. The foundation layer 2 is formed by growing a GaN layer on the buffer layer by using, for example, a TMG gas and an ammonia gas as raw material gases.

In the n-side contact layer forming step, the n-side contact layer 3 is formed on the foundation layer 2. The n-side contact layer 3 may be formed using, for example, a raw material gas containing Ga, a raw material gas containing N, and a raw material gas containing Si. The n-side contact layer 3 is formed by growing a GaN layer containing an n-type impurity by using, for example, a TMG gas, an ammonia gas, and a monosilane gas as the raw material gases. The temperature when the n-side contact layer 3 is formed is, for example, in a range from 1100° C. to 1200° C.

In the n-side superlattice layer forming step, the n-side superlattice layer 4 is formed on the n-side contact layer 3. The temperature when the n-side superlattice layer 4 is formed is preferably lower than the temperature when the n-side contact layer 3 is formed. The temperature when the n-side superlattice layer 4 is formed is, for example, in a range from 900° C. to 950° C. The n-side superlattice layer forming step includes a step of forming an undoped GaN layer by using, for example, a TEG gas and an ammonia gas as raw material gases, and a step of forming an undoped InGaN layer using, for example, a TEG gas, a TMI gas, and an ammonia gas as raw material gases. When the step of forming the undoped GaN layer and the step of forming the undoped InGaN layer are alternately performed a plurality of times, the n-side superlattice layer 4 is formed, in which the undoped GaN layer and the undoped InGaN layer are alternately layered. When the undoped GaN layer is formed, a gas containing $H_2$ may be used as a carrier gas.

Active Layer Forming Step

Figure 4:
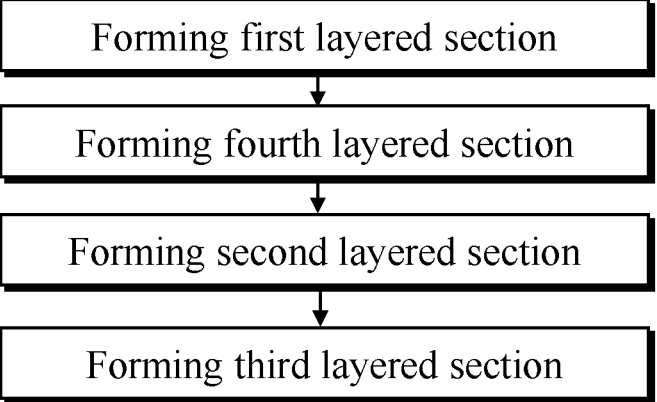
FIG. 4 is a process flowchart showing a process flow of a method for manufacturing a nitride semiconductor light-emitting element according to an embodiment of the present invention.

The active layer forming step is a step of forming the active layer 5 on the n-side layer 10. FIG. 4 is a process flowchart of the active layer forming step. As illustrated in FIG. 4, the active layer forming step includes a first layered section forming step, a second layered section forming step, and a third layered section forming step. The active layer forming step further includes a fourth layered section forming step after the first layered section forming step.

The first layered section forming step is a step of forming the first layered section 51 including the first well layer 51w and the first barrier layer 51b formed on the first well layer 51w. The first layered section 51 is formed on the n-side layer 10.

The first well layer 51w may be formed using, for example, a raw material gas containing In, a raw material gas containing Ga, and a raw material gas containing N. The first well layer 51w is formed by growing an undoped InGaN layer by using, for example, a TEG gas, a TMI gas, and an ammonia gas as the raw material gases. The flow ratio of the raw material gas containing In when the first well layer 51w is formed is preferably equal to the flow ratio of a raw material gas containing In when the second well layer 52w is formed. With this configuration, manufacturing conditions can be simplified, and a semiconductor layer having a desired composition can be easily formed.

The first well layer 51w is formed at a first temperature higher than a second temperature at which the second well layer 52w is formed. As a result, the first well layer 51w is formed with good crystallinity, and therefore a surface state of the semiconductor layer after performing the first layered section forming step can be nearly flat. This makes it possible to improve crystallinity of the second well layer 52w formed on the first layered section 51. The first temperature is preferably higher than the second temperature by not less than 50° C. and not more than 100° C., for example. The first temperature is in a range from 850° C. to 950° C., for example. The first thickness of the first well layer 51w is made less than the second thickness of the second well layer 52w. For example, by causing the time for forming the first well layer 51w to be shorter than the time for forming the second well layer 52w, the first thickness of the first well layer 51w may be made less than the second thickness of the second well layer 52w.

The first barrier layer 51b may be formed using, for example, a raw material gas containing Ga, a raw material gas containing Si, and a raw material gas containing N. The first barrier layer 51b is formed by growing a GaN layer doped with an n-type impurity by using, for example, a TEG gas, a monosilane gas, and an ammonia gas as the raw material gases. The temperature when the first barrier layer 51b is formed is, for example, in a range from 900° C. to 1000° C.

The second layered section forming step is a step of forming the second layered section 52 including the second well layer 52w and the second barrier layer 52b formed on the second well layer 52w. The second layered section 52 is formed on the first layered section 51. In a case in which the fourth layered section forming step is performed, the second layered section 52 is formed on the fourth layered section 54.

The second well layer 52w may be formed using, for example, a raw material gas containing In, a raw material gas containing Ga, and a raw material gas containing N. The second well layer 52w is formed by growing an undoped InGaN layer by using, for example, a TEG gas, a TMI gas, and an ammonia gas as the raw material gases.

The second well layer 52w is formed at the second temperature lower than the first temperature at which the first well layer 51w is formed. The second temperature is preferably lower than the first temperature by not less than 50° C. and not more than 100° C., for example. The second temperature is in a range from 750° C. to 850° C., for example. The second thickness of the second well layer 52w is made greater than the first thickness of the first well layer 51w. For example, by causing the time for forming the second well layer 52w to be longer than the time for forming the first well layer 51w, the second thickness of the second well layer 52w can be made greater than the first thickness of the first well layer 51w.

The second barrier layer 52b may be formed using, for example, a raw material gas containing Ga, a raw material gas containing Si, and a raw material gas containing N. The second barrier layer 52b is formed by growing a GaN layer doped with an n-type impurity by using, for example, a TEG gas, a monosilane gas, and an ammonia gas as the raw material gases. The temperature when the second barrier layer 52b is formed is, for example, in a range from 900° C. to 1000° C.

The growth rate when the second barrier layer 52b is formed is preferably less than the growth rate when the first barrier layer 51b is formed. For example, by causing the flow ratio of the raw material gas containing Ga when the second barrier layer 52b is formed to be lower than the flow ratio of the raw material gas containing Ga when the first barrier layer 51b is formed, the growth rate when the second barrier layer 52b is formed can be made less than the growth rate when the first barrier layer 51b is formed. This makes it possible to form the second barrier layer 52b with crystallinity better than that of the first barrier layer 51b. Causing the growth rate when the first barrier layer 51b is formed to be slow can improve the crystallinity but is likely to cause a thermal load to the n-side layer 10, which has already been formed when the first barrier layer 51b is formed. The growth rate when the second barrier layer 52b is formed is, for example, not less than 0.5 times and not more than 0.8 times the growth rate when the first barrier layer 51b is formed.

The third layered section forming step is a step of forming the third layered section 53 including the third well layer 53w and the third barrier layer 53b formed on the third well layer 53w. The third layered section 53 is formed on the second layered section 52.

The third well layer 53w may be formed using, for example, a raw material gas containing In, a raw material gas containing Ga, and a raw material gas containing N. The third well layer 53w is formed by growing an undoped InGaN layer by using, for example, a TEG gas, a TMI gas, and an ammonia gas as the raw material gases.

The third well layer 53w is formed at a third temperature higher than the second temperature at which the second well layer 52w is formed. As a result, the third well layer 53w is formed with good crystallinity, and therefore a surface state of the semiconductor layer after performing the third layered section forming step can be nearly flat. This makes it possible to improve crystallinity of the third barrier layer 53b formed on the third well layer 53w. The third temperature is preferably higher than the second temperature by not less than 50° C. and not more than 100° C., for example. The third temperature is in a range from 850° C. to 950° C., for example. The third thickness of the third well layer 53w is made less than the second thickness of the second well layer 52w.

The third barrier layer 53b may be formed using, for example, a raw material gas containing Ga, a raw material gas containing Mg, and a raw material gas containing N. The third barrier layer 53b is formed by growing a GaN layer doped with a p-type impurity by using, for example, a TEG gas, a Cp$_2$Mg gas, and an ammonia gas as the raw material gases. By doping the third barrier layer 53b with the p-type impurity, holes are likely to be supplied to the second well layer 52w. The temperature when the third barrier layer 53b is formed is, for example, in a range from 900° C. to 1000° C.

After forming the third well layer 53w, an undoped GaN layer may be formed as the first intermediate layer on the third well layer 53w. When the first intermediate layer is formed, the third barrier layer 53b doped with the p-type impurity is formed on the first intermediate layer. By forming the first intermediate layer, the deterioration in reliability due to diffusion of the p-type impurity, with which the third barrier layer 53b is doped, to the third well layer 53w side can be suppressed. By controlling the flow ratio of the raw material gas containing Mg, the third barrier layer 53b may be formed such that the impurity concentration of the third barrier layer 53b is lower than the p-type impurity concentration of the p-side barrier layer 6.

The fourth layered section forming step is a step of, after the first layered section forming step, forming the fourth layered section 54 including the fourth well layer 54w and the fourth barrier layer 54b formed on the fourth well layer 54w. The fourth layered section forming step is performed after the first layered section forming step and before the second layered section forming step. The fourth layered section 54 is formed on the first layered section 51.

The fourth well layer 54w may be formed using, for example, a raw material gas containing In, a raw material gas containing Ga, and a raw material gas containing N. The fourth well layer 54w is formed by growing an undoped InGaN layer by using, for example, a TEG gas, a TMI gas, and an ammonia gas as the raw material gases.

The fourth well layer 54w is formed at a fourth temperature higher than the second temperature at which the second well layer 52w is formed. As a result, the fourth well layer 54w is formed with good crystallinity, and therefore a surface state of the semiconductor layer after performing the fourth layered section forming step can be nearly flat. This makes it possible to improve the crystallinity of the second well layer 52w formed on the fourth layered section 54. The fourth temperature is preferably higher than the second temperature by not less than 50° C. and not more than 100° C., for example. The fourth temperature is in a range from 850° C. to 950° C., for example. The fourth thickness of the fourth well layer 54w is made less than the second thickness of the second well layer 52w.

The fourth barrier layer 54b may be formed using, for example, a raw material gas containing Ga, a raw material gas containing Si, and a raw material gas containing N. The fourth barrier layer 54b is formed by growing a GaN layer doped with an n-type impurity by using, for example, a TEG gas, a monosilane gas, and an ammonia gas as the raw material gases. The temperature when the fourth barrier layer 54b is formed is, for example, in a range from 900° C. to 1000° C.

The growth rate when the fourth barrier layer 54b is formed is preferably less than the growth rate when the first barrier layer 51b is formed. For example, by causing the flow ratio of the raw material gas containing Ga when the fourth barrier layer 54b is formed to be lower than the flow ratio of the raw material gas containing Ga when the first barrier layer 51b is formed, the growth rate when the fourth barrier layer 54b is formed may be made less than the growth rate when the first barrier layer 51b is formed. This makes it possible to form the fourth barrier layer 54b with crystallinity better than that of the first barrier layer 51b. The growth rate when the fourth barrier layer 54b is formed is, for example, not less than 0.5 times and not more than 0.8 times the growth rate when the first barrier layer 51b is formed.

It is preferable that the second layered section forming step be performed a plurality of times and that the third layered section forming step be performed once. As a result, the plurality of second well layers 52w are formed, and radiative recombination is more likely to occur than in a case in which the one second well layer 52w is formed, whereby the output can be improved. By causing the number of third barrier layers 53b doped with the p-type impurity to be one, it is possible to reduce the diffusion of the p-type impurity into the second well layer 52w. The second layered section forming step may be performed not less than four times and not more than eight times, for example.

It is preferable that the first layered section forming step be performed a plurality of times. By forming the plurality of first layered sections 51 each formed with good crystallinity, the surface state of the semiconductor layer after performing the first layered section forming steps can be nearly flat as compared to the case of forming the one first layered section 51. As a result, the second well layer 52w formed on the first layered section 51 can be formed having better crystallinity. The first layered section forming step may be performed not less than four times and not more than six times, for example. The fourth layered section forming step is preferably performed a plurality of times. By forming the plurality of fourth layered sections 54 each formed with good crystallinity, the surface state of the semiconductor layer after performing the fourth layered section forming steps can be nearly flat as compared to the case of forming the one fourth layered section 54. As a result, the second well layer 52w formed on the fourth layered section 54 can be formed having better crystallinity. The fourth layered section forming step may be performed not less than twice and not more than four times, for example.

In order to reduce decomposition of the InGaN layers constituting the first well layer 51w, the second well layer 52w, and the third well layer 53w, after each of these well layers is formed, a second intermediate layer may be formed on the well layer. The second intermediate layer may be formed by growing an undoped GaN layer by using, for example, a TEG gas and an ammonia gas as raw material gases.

Each of the first temperature, the third temperature, and the fourth temperature is higher than the second temperature. The first temperature, the third temperature, and the fourth temperature may be, for example, the same temperature. The first temperature, the third temperature, and the fourth temperature need not be the same temperature but may be different temperatures from each other. For example, the first temperature and the fourth temperature may be higher than the third temperature. As a result, the crystallinity of the first well layer $51w$ and the fourth well layer $54w$ forming a foundation when the second well layer $52w$ is formed is improved, and the crystallinity of the second well layer $52w$ can be further improved, so that the output of the nitride semiconductor light-emitting element $100$ can be improved.

P-Side Layer Forming Step

The p-side layer forming step is a step of forming the p-side layer $20$ on the active layer $5$. The p-side layer forming step includes a p-side barrier layer forming step and a p-side contact layer forming step.

In the p-side barrier layer forming step, the p-side barrier layer $6$ is formed on the active layer $5$. The p-side barrier layer $6$ is formed by growing an AlGaN layer doped with a p-type impurity by using, for example, a TEG gas, a TMA gas, a $Cp_2Mg$ gas, and an ammonia gas as raw material gases.

In the p-side contact layer forming step, the p-side contact layer $7$ is formed on the p-side barrier layer $6$. In forming the p-side contact layer $7$, an undoped GaN layer is formed using, for example, a TMG gas and an ammonia gas as raw material gases. Thereafter, a GaN layer containing a p-type impurity is formed on the layer formed of the undoped GaN, by using a TMG gas, a $Cp_2Mg$ gas, and an ammonia gas as raw material gases. Thus, the p-side contact layer $7$ including the undoped GaN layer and the GaN layer containing the p-type impurity is formed. From the viewpoint of lowering a forward voltage Vf, the impurity concentration of the p-side contact layer $7$ is preferably higher than that of the p-side barrier layer $6$.

After the respective semiconductor layers are formed through the above-described steps, each of the semiconductor layers is subjected to heat treatment in a reaction vessel. The heat treatment is performed, for example, in a nitrogen atmosphere at a temperature in a range from 650° C. to 800° C.

Electrode Forming Step

After the heat treatment, part of the p-side layer $20$ and part of the active layer $5$ are removed to expose part of the surface of the n-side contact layer $3$. The above-mentioned partial removal of the p-side layer $20$ and the active layer $5$ may be carried out using a reactive ion etching technique, for example.

Thereafter, the p-electrode $40$ is formed on part of the upper surface of the p-side contact layer $7$, and the n-electrode $30$ is formed on part of the exposed surface of the n-side contact layer $3$. Through the steps described above, the nitride semiconductor light-emitting element $100$ is fabricated. The n-electrode $30$ and the p-electrode $40$ may be formed by vapor deposition or sputtering, for example.

As described above, the active layer $5$, in which electrons and holes are efficiently supplied to the second well layer $52w$ and radiative recombination is more likely to occur in the second well layer $52w$ than in the other well layers, can be formed. Therefore, according to the method for manufacturing the nitride semiconductor light-emitting element of the present embodiment, it is possible to manufacture the nitride semiconductor light-emitting element $100$ with improved output.

EXAMPLES

A nitride semiconductor light-emitting element was fabricated by the manufacturing method described below. Each semiconductor layer was formed by the MOCVD method.

Substrate $1$

A substrate made of sapphire taking a C plane as a primary surface was used as the substrate $1$. Then, in a reaction vessel, the sapphire (C plane) on which a nitride semiconductor was to be formed was cleaned in a hydrogen atmosphere at a temperature of 1050° C. The outer shape of the substrate $1$ was a square having a side length of 650 μm in a plan view.

Buffer Layer

A TMA gas, a TMG gas, and an ammonia gas were used as raw material gases to form a buffer layer made of AlGaN and having a thickness of about 12 nm on the substrate $1$. The buffer layer was formed at a temperature of 550° C.

Foundation Layer $2$

Next, at a temperature of 1050° C., a TMG gas and an ammonia gas were used as raw material gases to form GaN with a thickness of about 1 μm on the buffer layer. Subsequently, at a temperature of 1150° C., a TMG gas and an ammonia gas were used as raw material gases to form GaN with a thickness of about 1 μm. The foundation layer $2$ composed of the two GaN layers formed as discussed above was formed.

N-Side Contact Layer $3$

Next, the n-side contact layer $3$ made of GaN doped with Si at $1 \times 10^{19}/cm^3$ was formed with a thickness of 6 μm on the foundation layer $2$ at a temperature of 1150° C. by using a TMG gas, an ammonia gas, and a monosilane gas.

N-Side Superlattice Layer $4$

Next, a step of forming an undoped GaN layer and a step of forming an undoped InGaN layer were repeatedly performed to form the n-side superlattice layer $4$. The step of forming the undoped GaN layer and the step of forming the undoped InGaN layer were defined as one cycle, and the cycle was repeated 30 times to form the n-side superlattice layer $4$ including 30 undoped GaN layers and 30 undoped InGaN layers.

In the step of forming the undoped GaN layer, the temperature was set to 910° C., a TEG gas and an ammonia gas were used as raw material gases, and thus the layer made of GaN with a thickness of 3 nm was formed. In the step of forming the undoped InGaN layer, the temperature was set to 910° C., a TEG gas, a TMI gas, and an ammonia gas were used as raw material gases, and thus the layer made of InGaN with a thickness of 1.5 nm was formed.

Active Layer $5$

Next, at a temperature of 860° C., the first well layer $51w$ made of $In_{0.15}Ga_{0.85}N$ with a thickness of 1.5 nm was formed using a TEG gas, a TMI gas, and an ammonia gas as raw material gases. Further, the first barrier layer $51b$ made of GaN doped with an n-type impurity and having a thickness of 15 nm was formed on the first well layer $51w$ at a temperature of 960° C. by using a TEG gas, a monosilane gas, and an ammonia gas as raw material gases. The first layered section forming step for forming the first well layer $51w$ and the first barrier layer $51b$ in the manner discussed above was repeatedly performed five times.

Subsequently, at a temperature of 860° C., the fourth well layer $54w$ made of $In_{0.15}Ga_{0.85}N$ with a thickness of 1.5 nm was formed using a TEG gas, a TMI gas, and an ammonia gas as raw material gases. Further, the fourth barrier layer 54b made of GaN doped with an n-type impurity and having a thickness of 16 nm was formed on the fourth well layer 54w at a temperature of 960° C. by using a TEG gas, a monosilane gas, and an ammonia gas as raw material gases. The fourth layered section forming step for forming the fourth well layer 54w and the fourth barrier layer 54b in the manner discussed above was repeatedly performed twice.

Subsequently, at a temperature of 800° C., the second well layer 52w made of $In_{0.25}Ga_{0.75}N$ with a thickness of 2.8 nm was formed using a TEG gas, a TMI gas, and an ammonia gas as raw material gases. Further, the second barrier layer 52b made of GaN doped with an n-type impurity and having a thickness of 9 nm was formed on the second well layer 52w at a temperature of 960° C. by using a TEG gas, a monosilane gas, and an ammonia gas as raw material gases. The second layered section forming step for forming the second well layer 52w and the second barrier layer 52b in the manner discussed above was repeatedly performed six times.

Subsequently, at a temperature of 860° C., the third well layer 53w made of $In_{0.15}Ga_{0.85}N$ with a thickness of 1.5 nm was formed using a TEG gas, a TMI gas, and an ammonia gas as raw material gases. Then, the first intermediate layer made of GaN with a thickness of 5.3 nm was formed on the third well layer 53w by using a TEG gas and an ammonia gas as raw material gases. Further, the third barrier layer 53b made of GaN doped with a p-type impurity and having a thickness of 13 nm was formed on the first intermediate layer at a temperature of 960° C. by using a TEG gas, a $Cp_2Mg$ gas, and an ammonia gas as raw material gases. The third layered section forming step for forming the third well layer 53w and the third barrier layer 53b in the manner discussed above was performed once.

P-Side Barrier Layer 6

Subsequently, at a temperature of 960° C., the p-side barrier layer 6 made of $Al_{0.13}Ga_{0.87}N$ doped with Mg at $2\times10^{20}/cm^3$ and having a thickness of 11 nm was formed using a TEG gas, a TMA gas, a $Cp_2Mg$ gas, and an ammonia gas as raw material gases.

P-Side Contact Layer 7

Next, at a temperature in a range from 850° C. to 1000° C., a TMG gas and an ammonia gas were used to form a layer made of undoped GaN with a thickness of about 80 nm. Further, on the above GaN layer, a layer made of GaN doped with Mg at $5\times10^{20}/cm^3$ was formed with a thickness of about 20 nm by using a TMG gas, an ammonia gas, and a $Cp_2Mg$ gas. The p-side contact layer 7 composed of the two GaN layers formed as discussed above was formed.

After the semiconductor layers were formed, each of the semiconductor layers was subjected to heat treatment in a reaction vessel. The heat treatment was performed in a nitrogen atmosphere at a temperature of 700° C.

After the heat treatment, part of the p-side layer 20 and part of the active layer 5 were removed to expose part of the n-side contact layer 3 from the p-side layer 20 and the active layer 5.

Finally, the n-electrode 30 was formed on the upper surface of the n-side contact layer 3, and the p-electrode 40 was formed on the upper surface of the p-side contact layer 7.

A forward voltage Vf was 2.74 V and output Po was 115.7 mW in the nitride semiconductor light-emitting element of the example fabricated as described above. The half-width was 26 1 nm. In the example, the forward voltage Vf and the output Po were values obtained when a current of 100 mA was applied.

REFERENCE EXAMPLES

A nitride semiconductor light-emitting element according to a reference example was fabricated in the same manner as that in the above-described example except that the active layer 5 was formed under the following conditions.
Active Layer 5

In the reference example, the temperatures when the first well layer 51w was formed, the third well layer 53w, and the fourth well layer 54w were each set to 800° C. The thickness of the third well layer 53w was 3.2 nm, and the thickness of the fourth well layer 54w was 2.8 nm.

A forward voltage Vf was 2.73 V and output Po was 105.3 mW in the nitride semiconductor light-emitting element of the reference example fabricated as described above. The half-width was 29.7 nm. In the reference example, the forward voltage Vf and the output Po were values obtained when a current of 100 mA was applied as in the example.

As described above, according to the nitride semiconductor light-emitting element of the present example, the output is improved by making the second thickness of the second well layer 52w greater than the first thickness of the first well layer 51w and the third thickness of the third well layer 53w and making the first temperature and the third temperature higher than the second temperature. Further, because the half-width of the nitride semiconductor light-emitting element of the example is smaller than that of the nitride semiconductor light-emitting element of the reference example, it is assumed that electrons and holes are efficiently supplied to the second well layer 52w and radiative recombination occurs mainly in the second well layer 52w.

What is claimed is:

1. A method for manufacturing a nitride semiconductor light-emitting element, the method comprising:
   forming an n-side layer;
   forming an active layer on the n-side layer; and
   forming a p-side layer on the active layer; wherein:
   the step of forming the active layer comprises:
      forming a first layered section comprising a first well layer containing In and having a first thickness, and a first barrier layer located on the first well layer and doped with an n-type impurity, the first well layer being formed at a first temperature,
      forming a second layered section on the first layered section, the second layered section comprising a second well layer containing In and having a second thickness greater than the first thickness, and a second barrier layer located on the second well layer and doped with an n-type impurity, the second well layer being formed at a second temperature lower than the first temperature, and
      forming a third layered section on the second layered section, the third layered section comprising a third well layer containing In and having a third thickness less than the second thickness, and a third barrier layer located on the third well layer and doped with a p-type impurity, the third well layer being formed at a third temperature higher than the second temperature.

2. The method according to claim 1, wherein:
   the step of forming the active layer further comprises, after the forming the first layered section, forming a fourth layered section on the first layered section, the fourth layered section comprising a fourth well layer with a fourth thickness, and a fourth barrier layer formed on the fourth well layer and doped with an n-type impurity; and a growth rate at which the fourth barrier layer is formed is less than a growth rate at which the first barrier layer is formed.

3. The method according to claim 1, wherein:

in the step of forming the first layered section, the first well layer is formed using a raw material gas containing In, a raw material gas containing Ga, and a raw material gas containing N;

in the step of forming the second layered section, the second well layer is formed using a raw material gas containing In, a raw material gas containing Ga, and a raw material gas containing N; and a flow ratio of the raw material gas containing In when the first well layer is formed is equal to a flow ratio of the raw material gas containing In when the second well layer is formed.

4. The method according to claim 1, wherein:

the step of forming the second layered section is performed a plurality of times; and the step of forming the third layered section is performed once.

5. The method according to claim 4, wherein:

the step of forming the first layered section is performed a plurality of times.

6. The method according to claim 1, wherein:

the second thickness of the second well layer is not less than 1.5 times and not more than 3 times the first thickness of the first well layer.

7. The method according to claim 2, wherein:

the second thickness of the second well layer is not less than 1.5 times and not more than 3 times the first thickness of the first well layer.

8. The method according to claim 3, wherein:

the second thickness of the second well layer is not less than 1.5 times and not more than 3 times the first thickness of the first well layer.

9. The method according to claim 1, wherein:

a thickness of the second barrier layer is less than a thickness of the first barrier layer.

10. The method according to claim 2, wherein:

a thickness of the second barrier layer is less than a thickness of the first barrier layer.

11. The method according to claim 3, wherein:

a thickness of the second barrier layer is less than a thickness of the first barrier layer.

12. The method according to claim 1, wherein:

the first temperature and the third temperature are higher than the second temperature by not less than 50° C. and not more than 100° C.

13. The method according to claim 2, wherein:

the first temperature and the third temperature are higher than the second temperature by not less than 50° C. and not more than 100° C.

14. The method according to claim 3, wherein:

the first temperature and the third temperature are higher than the second temperature by not less than 50° C. and not more than 100° C.

15. The method according to claim 1, wherein:

an In composition ratio of the first well layer is in a range from 10% to 15%; and an In composition ratio of the second well layer is in a range from 20% to 28%.

16. The method according to claim 2, wherein:

an In composition ratio of the first well layer is in a range from 10% to 15%; and an In composition ratio of the second well layer is in a range from 20% to 28%.

17. The method according to claim 3, wherein:

an In composition ratio of the first well layer is in a range from 10% to 15%; and an In composition ratio of the second well layer is in a range from 20% to 28%.

* * * * *